United States Patent
Rodriguez et al.

(10) Patent No.: US 7,894,234 B2
(45) Date of Patent: Feb. 22, 2011

(54) F-SRAM BEFORE PACKAGE SOLID DATA WRITE

(75) Inventors: John A. Rodriguez, Dallas, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 12/502,860

(22) Filed: Jul. 14, 2009

(65) Prior Publication Data

US 2010/0027313 A1    Feb. 4, 2010

Related U.S. Application Data

(60) Provisional application No. 61/085,157, filed on Jul. 31, 2008.

(51) Int. Cl.
*G11C 11/22*    (2006.01)
(52) U.S. Cl. .................. 365/145; 365/149; 365/154
(58) Field of Classification Search ............... 365/145, 365/149, 154, 156
See application file for complete search history.

(56) References Cited

U.S. PATENT DOCUMENTS

| | | | | |
|---|---|---|---|---|
| 6,947,310 B1 * | 9/2005 | Marshall et al. | ............. | 365/145 |
| 7,667,997 B2 * | 2/2010 | Rodriguez | .................. | 365/145 |
| 2010/0097839 A1 * | 4/2010 | Kim | ........................... | 365/145 |
| 2010/0097840 A1 * | 4/2010 | Kim | ........................... | 365/145 |
| 2010/0135062 A1 * | 6/2010 | Kim | ........................... | 365/145 |

OTHER PUBLICATIONS

John Rodriguez, "Method to Improve Ferroelectric Memory Performance and Reliability," Nonprovisional Patent Application Filed Dec. 27, 2007; U.S. Appl. No. 11/965,350.

* cited by examiner

*Primary Examiner*—Gene N Auduong
(74) *Attorney, Agent, or Firm*—Rose Alyssa Keagy; Wade J. Brady, III; Frederick J. Telecky, Jr.

(57) ABSTRACT

A process of polarizing a programmable data storage component of an integrated circuit by polarizing the ferroelectric capacitors in the same orientation and then removing power from the integrated circuit. A process polarizing a programmable data storage component of an integrated circuit by polarizing the ferroelectric capacitors in the same orientation, then removing power from the integrated circuit. A process of polarizing a programmable data storage component of an integrated circuit by polarizing corresponding ferroelectric capacitors in same orientations, then removing power from the integrated circuit. An integrated circuit containing a programmable data storage component and a ferroelectric capacitor polarization circuit that is configured to polarize a first data ferroelectric capacitor and a second data ferroelectric capacitor in desired polarization configurations by applying biases to a first state node, a second state node, a first plate node, and a second plate node.

20 Claims, 7 Drawing Sheets

F-SRAM BEFORE PACKAGE SOLID DATA WRITE

CROSS-REFERENCE TO RELATED APPLICATIONS

This application claims the benefit of U.S. Provisional Application No. 61/085,157, filed Jul. 31, 2008, which is commonly assigned and incorporated herein by this reference. In addition, this application is related to patent application Ser. No. 11/965,350 (filed Dec. 27, 2007) entitled "METHOD TO IMPROVE FERROELECTRIC MEMORY PERFORMANCE AND RELIABILITY", with it's mention in this section, this patent application is not admitted to be prior art with respect to the present invention.

FIELD OF THE INVENTION

This invention relates to the field of integrated circuits. More particularly, this invention relates to ferroelectric capacitors in integrated circuits.

DETAILED DESCRIPTION

Figure 1:
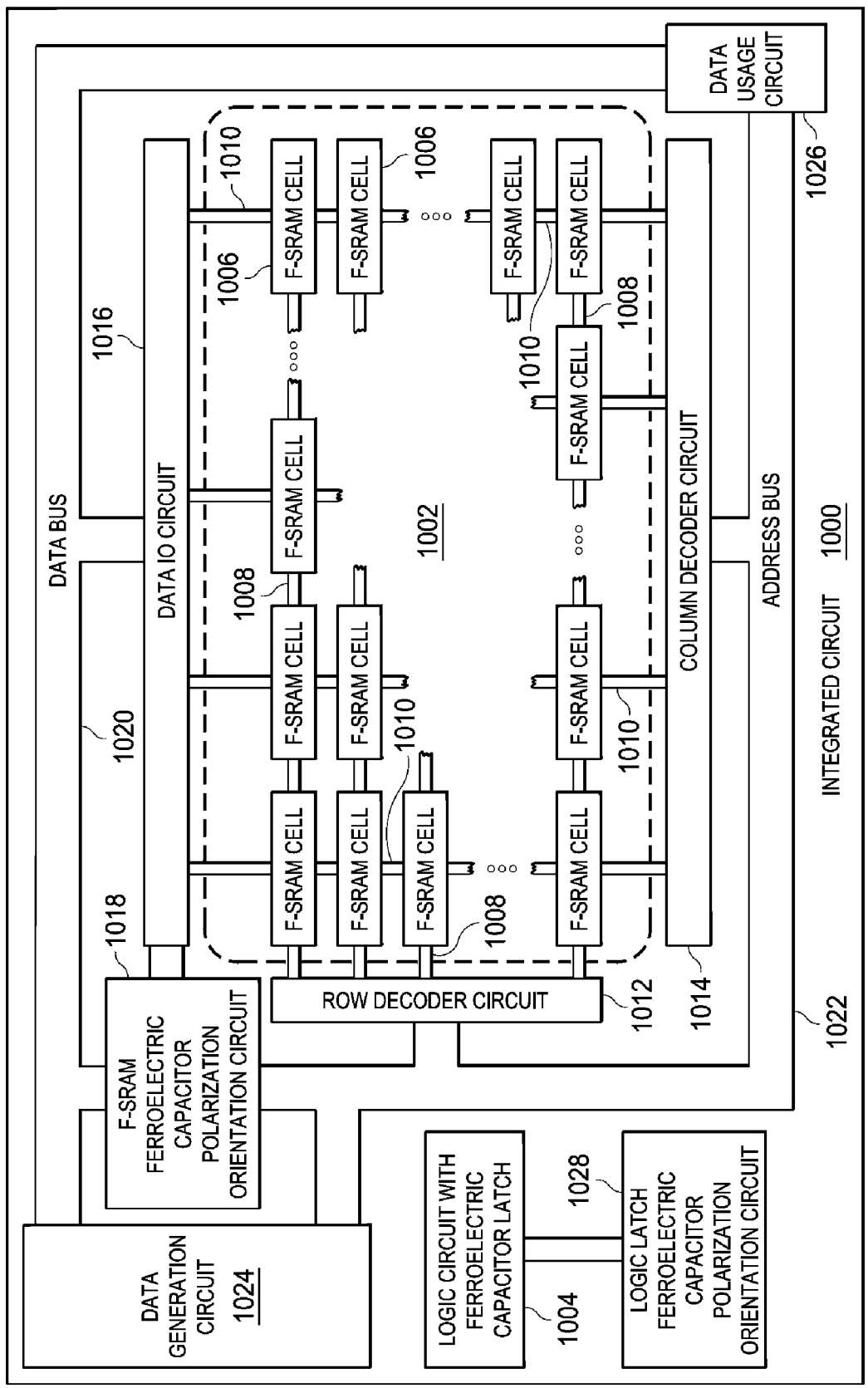
FIG. 1 is an integrated circuit containing an F-SRAM cell array or a logic circuit with ferroelectric capacitor latches.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Ferroelectric capacitors in a programmable data storage component may be described as data ferroelectric capacitors or load ferroelectric capacitors. Data ferroelectric capacitors are connected to plate nodes which are pulsed during recall operations. Load ferroelectric capacitors are connected to plate nodes which are statically biased during recall operations.

An integrated circuit may be built by forming programmable data storage components with two complementary state nodes and at least two data ferroelectric capacitors. The programmable data storage components may be ferroelectric SRAM (F-SRAM) cells or logic latches, with the ferroelectric capacitors configured to provide non-volatile retention of data values, sometimes referred to as "backup". A circuit capable of polarizing each data ferroelectric capacitor to achieve a desired polarization configuration may also be formed in the integrated circuit. Forming the integrated circuit further includes placing the data ferroelectric capacitors in the desired polarization configuration prior to a thermal cycle process, such as a packaging process involving encapsulation or an assembly process involving soldering, and subsequently removing power from the integrated circuit.

For the purposes of this disclosure, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential. The term "floated" is understood to mean disconnected from a voltage source such as Vdd or Vss, or connected to a voltage source through a high impedance, for example a transistor, a resistor or a diode, so as to limit charge accumulation on a floated node.

The term "complementary state nodes" refers to state nodes in a data storage component which have opposite polarity voltages when power is applied to the data storage component.

The term "programming" is understood to refer to a process of polarizing data ferroelectric capacitors in a programmable data storage component so as to provide data retention when power is removed from the programmable data storage component. The term "recall" is understood to refer to a process of biasing data ferroelectric capacitors in a programmable data storage component which have been programmed so that the programmable data storage component returns to the programmed data state when power is reapplied to the programmable data storage component.

FIG. 1 is an integrated circuit (1000) containing an F-SRAM cell array (1002) or a logic circuit with ferroelectric capacitor latches (1004). The following discussion in reference to FIG. 1 applies to an embodiment of the integrated circuit (1000) which includes both the F-SRAM cell array (1002) and the logic circuit with ferroelectric capacitor latches (1004). Each F-SRAM cell (1006) in the F-SRAM cell array (1002) includes two or four ferroelectric capacitors coupled to a first state node and a second state node. Each word line bus (1008) is connected to F-SRAM cells (1006) in a row. Each word line bus (1008) may include more than one word line. Each bit line bus (1010) is connected to F-SRAM cells (1006) in a column. Each bit line bus (1010) may include one or more bit or bit-bar lines. A row decoder circuit (1012) applies appropriate biases to word lines in the word line buses (1008). A column decoder circuit (1014) applies appropriate biases to bit or bit-bar lines in the bit line buses (1010). A data input/output (IO) circuit (1016) reads data from the bit or bit-bar lines in the bit line buses (1010) during read operations and applies appropriate potentials to the bit or bit-bar lines in the bit line buses (1010) during single sided write operations. The integrated circuit further includes a data bus (1020) which carries data bits between the data IO circuit (1016) and circuits in the integrated circuit (1000), and an address bus (1022) which is used to select F-SRAM cells (1006) in the F-SRAM cell array (1002) for read and write operations. The address bus (1022) is connected to the row decoder circuit (1012) and the column decoder circuit (1014).

An F-SRAM ferroelectric capacitor polarization circuit (1018) is configured to apply signals and biases to the data IO circuit (1016) so as to polarize each ferroelectric capacitor in the F-SRAM cells to a desired polarization configuration. In some realizations of the instant embodiment, bias voltages or timing signals for the F-SRAM ferroelectric capacitor polarization circuit (1018) may be provided externally to the integrated circuit (1000), for example by a piece of test equipment. The F-SRAM ferroelectric capacitor polarization circuit (1018) may also be connected to the address bus (1022) and possibly to the data bus (1020). The integrated circuit (1000) may also contain a data generation circuit (1024) which connects to the data bus (1020) and address bus (1022). The data generation circuit (1024) produces incoming data bits for storage in the F-SRAM cell array (1002). The data bus (1020) carries the incoming data bits from the data generation circuit (1024) to the F-SRAM cell array (1002). The integrated circuit (1000) may also contain a data usage circuit (1026) which connects to the data bus (1020) and address bus (1022). The data usage circuit (1026) uses outgoing data bits which were stored in the F-SRAM cell array (1002). The data bus (1020) carries the outgoing data bits from the F-SRAM cell array (1002) to the data usage circuit (1026). The integrated circuit (1000) also contains a logic latch ferroelectric capacitor polarization circuit (1028) which is configured to apply signals and biases to the logic circuit with ferroelectric capacitor latches (1004) so as to polarize each ferroelectric capacitor in the logic latches to a desired polarization configuration.

Figure 2:
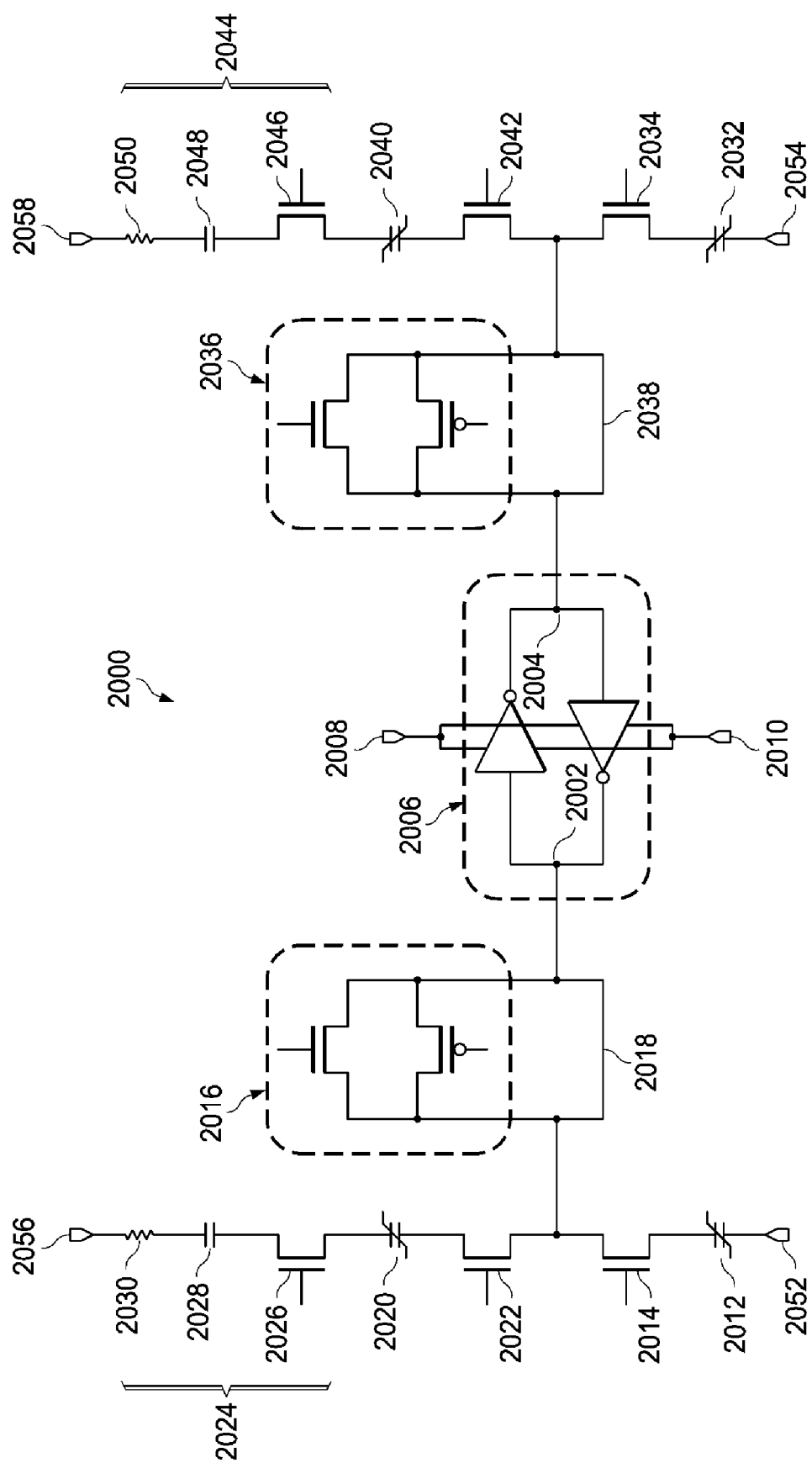
FIG. 2 is a circuit diagram of a programmable data storage component containing two complementary state nodes and at least two data ferroelectric capacitors.

FIG. 2 is a circuit diagram of a programmable data storage component (2000) containing two complementary state nodes and at least two data ferroelectric capacitors. A first state node (2002) and a second state node (2004) are complementary state nodes coupled by a data storage circuit (2006) which may be a pair of cross-coupled inverters as depicted in FIG. 2, or may be another realization of a circuit with two complementary state nodes. Vdd is applied to the data storage circuit (2006) through a Vdd node (2008), and Vss is applied to the data storage circuit (2006) through a Vss node (2010). The programmable data storage component (2000) contains a first data ferroelectric capacitor (2012) which is coupled to the first state node (2002), possibly through an optional first isolation transistor (2014), and through one of an optional first CMOS switch (2016) or an optional first direct connection (2018). In one realization of the instant embodiment, the programmable data storage component (2000) may contain an optional first auxiliary ferroelectric capacitor (2020), which may be a data ferroelectric capacitor or a load ferroelectric capacitor, coupled to the first state node (2002), possibly through an optional first auxiliary capacitor isolation transistor (2022). In another realization, the programmable data storage component (2000) may contain an optional first recall load (2024) coupled to the first data ferroelectric capacitor (2012), possibly including an optional first recall load transistor (2026), an optional first recall load capacitor (2028) or an optional first load recall resistor (2030).

The programmable data storage component (2000) may contain an optional second data ferroelectric capacitor (2032) coupled to the second state node (2004), possibly through an optional second isolation transistor (2034), and through one of an optional second CMOS switch (2036) or an optional second direct connection (2038). In one realization, the programmable data storage component (2000) may contain a second auxiliary ferroelectric capacitor (2040), which may be a data ferroelectric capacitor or a load ferroelectric capacitor, coupled to the second state node (2004), possibly through an optional second auxiliary capacitor isolation transistor (2042). In another realization, the programmable data storage component (2000) may contain an optional second recall load (2044) coupled to the second data ferroelectric capacitor (2032), possibly including an optional second recall load transistor (2046), an optional second recall load capacitor (2048) or an optional second load recall resistor (2050).

The first data ferroelectric capacitor (2012) may be polarized by applying a potential difference to the first state node (2002) and a first plate node (2052) while appropriate timing signals are applied to gate nodes of the isolation transistor (2014) if present, or the CMOS switch (2016) if present, possibly by a programmable data storage component ferroelectric capacitor polarization circuit (such as the ferroelectric capacitor polarization circuit (1018) shown in FIG. 1). The second data ferroelectric capacitor (2032) if present may be polarized by applying a potential difference to the second state node (2004) and a second plate node (2054) while appropriate timing signals are applied to gate nodes of the isolation transistor (2034) if present, or the CMOS switch (2036) if present, possibly by the programmable data storage component ferroelectric capacitor polarization circuit. In realizations of the instant embodiment in which the first auxiliary ferroelectric capacitor (2020) is present and is a data ferroelectric capacitor, the first auxiliary ferroelectric capacitor (2020) may be polarized by applying a potential difference to the first state node (2002) and a first auxiliary plate node (2056) while appropriate timing signals are applied to gate nodes of the isolation transistor (2022) if present, or the CMOS switch (2016) if present, possibly by the programmable data storage component ferroelectric capacitor polarization circuit. In realizations of the instant embodiment in which the second auxiliary ferroelectric capacitor (2040) is present and is a data ferroelectric capacitor, the second auxiliary ferroelectric capacitor (2040) may be polarized by applying a potential difference to the second state node (2004) and a second auxiliary plate node (2058) while appropriate timing signals are applied to gate nodes of the isolation transistor (2042) if present, or the CMOS switch (2036) if present, possibly by the programmable data storage component ferroelectric capacitor polarization circuit.

It will be recognized that other configurations may be formed for isolating ferroelectric capacitors in a programmable data storage component. It is within the scope of the instant invention to generate desired polarization configurations in programmable data storage component with other ferroelectric capacitor isolation configurations than those depicted in FIG. 2.

The programmable data storage component (2000) includes the first data ferroelectric capacitor (2012) and at least one additional data ferroelectric capacitor, selected from the first auxiliary ferroelectric capacitor (2020) if present, the second data ferroelectric capacitor (2032) if present and the second auxiliary ferroelectric capacitor (2040) if present. Configuring the ferroelectric capacitors (2012) and (2020), (2032) or (2040) as described in reference to FIG. 2 may provide data retention when power is removed from the data storage circuit (2006). Other components which may be included in specific realizations of the programmable data storage component (2000), such as passgate transistors, bit data lines or word lines, are not shown in FIG. 2 for simplicity.

In a programmable data storage component containing at least two data ferroelectric capacitors as described in reference to FIG. 2, the ferroelectric capacitors may be polarized in various polarization configurations. FIG. 3A through FIG. 3D depict polarization configurations for programmable data storage components containing four data ferroelectric capacitors where two of the data ferroelectric capacitors are coupled to a first state node (such as first state node 2002 of FIG. 2) and the other two data ferroelectric capacitors are coupled to a second state node (such as second state node 2004 of FIG. 2).

Figure 3A:
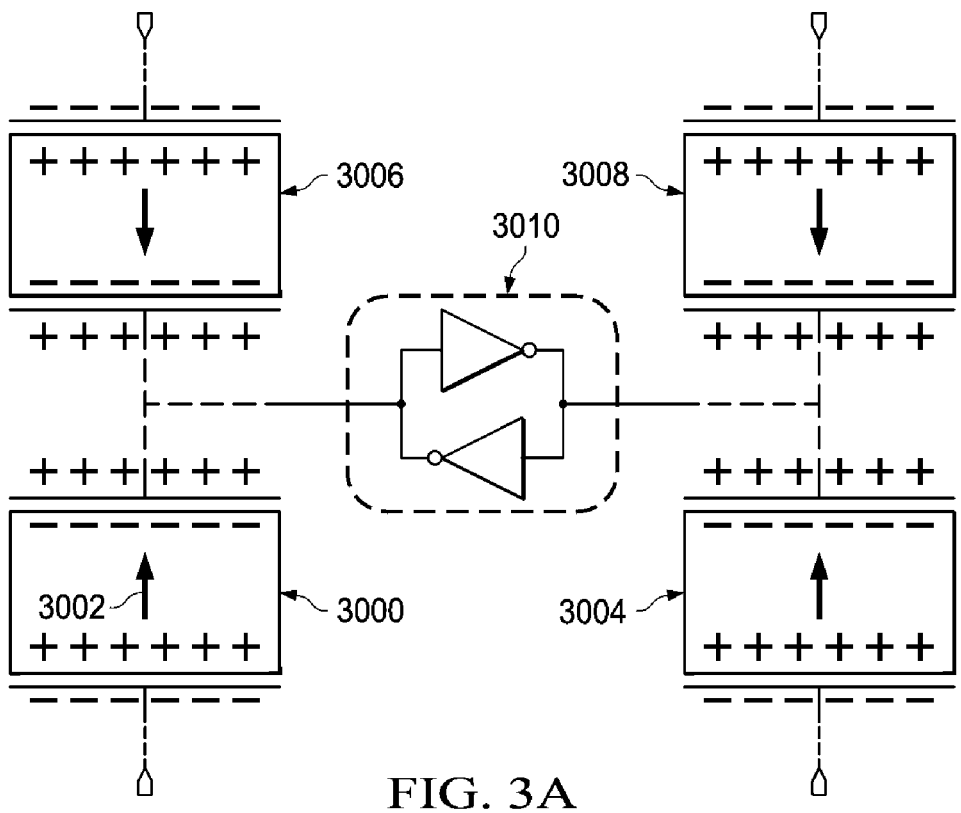
FIG. 3A through FIG. 3H depict examples of polarization configurations for programmable data storage component containing data ferroelectric capacitors.

Referring to FIG. 3A, a first data ferroelectric capacitor (3000) is in an "up" polarization orientation, as denoted by a polarization arrow (3002). A second data ferroelectric capacitor (3004) is also in the "up" polarization orientation. Thus, the second data ferroelectric capacitor (3004) is polarized in a same orientation as the first data ferroelectric capacitor (3000). A first auxiliary data ferroelectric capacitor (3006) is in a "down" polarization orientation, and a second auxiliary data ferroelectric capacitor (3008) is also in the "down" polarization orientation. Thus, the second auxiliary data ferroelectric capacitor (3008) is polarized in a same orientation as the first auxiliary data ferroelectric capacitor (3006). The data ferroelectric capacitors (3000, 3004, 3006, 3008) are coupled to a data storage circuit (3010), which may be similar to the data storage circuit (2006) described in reference to FIG. 2.

Figure 3B:
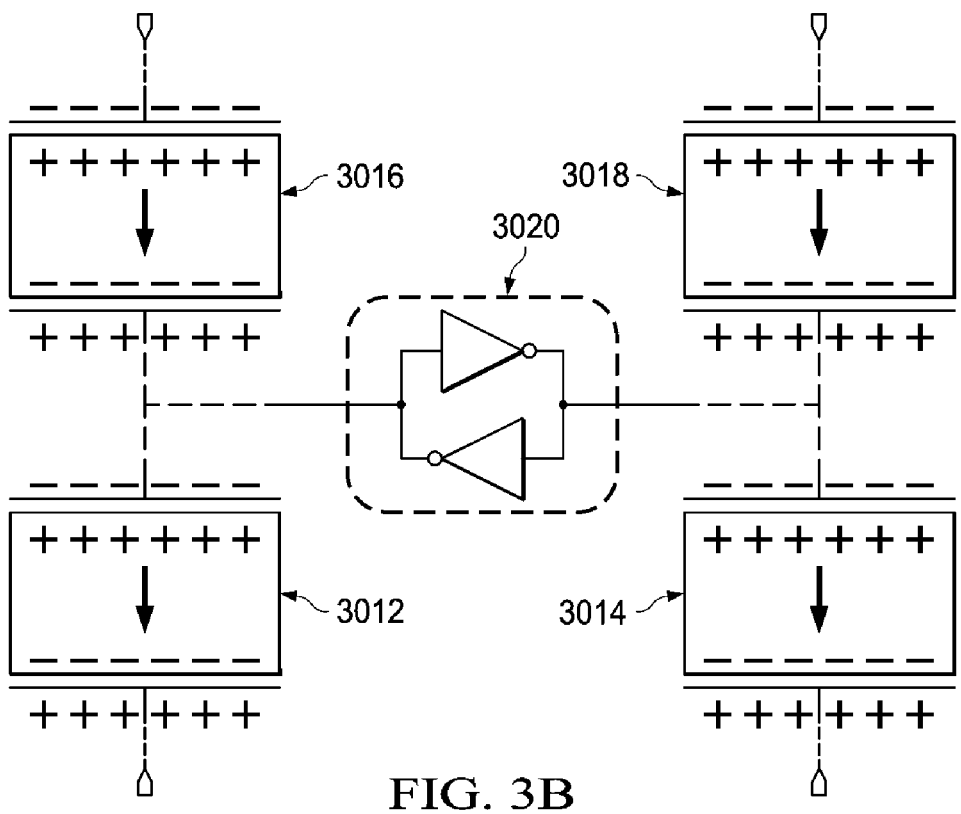

Referring to FIG. 3B, a first data ferroelectric capacitor (3012), a second data ferroelectric capacitor (3014), a first auxiliary data ferroelectric capacitor (3016), and a second auxiliary data ferroelectric capacitor (3018) are all in the "down" polarization orientation. Thus, the first auxiliary data ferroelectric capacitor (3016) is polarized in a same orientation as the first data ferroelectric capacitor (3012), and the second auxiliary data ferroelectric capacitor (3018) is polarized in a same orientation as the second data ferroelectric capacitor (3014). The data ferroelectric capacitors (3012, 3014, 3016, 3018) are coupled to a data storage circuit (3020) as described in reference to FIG. 2.

Figure 3C:
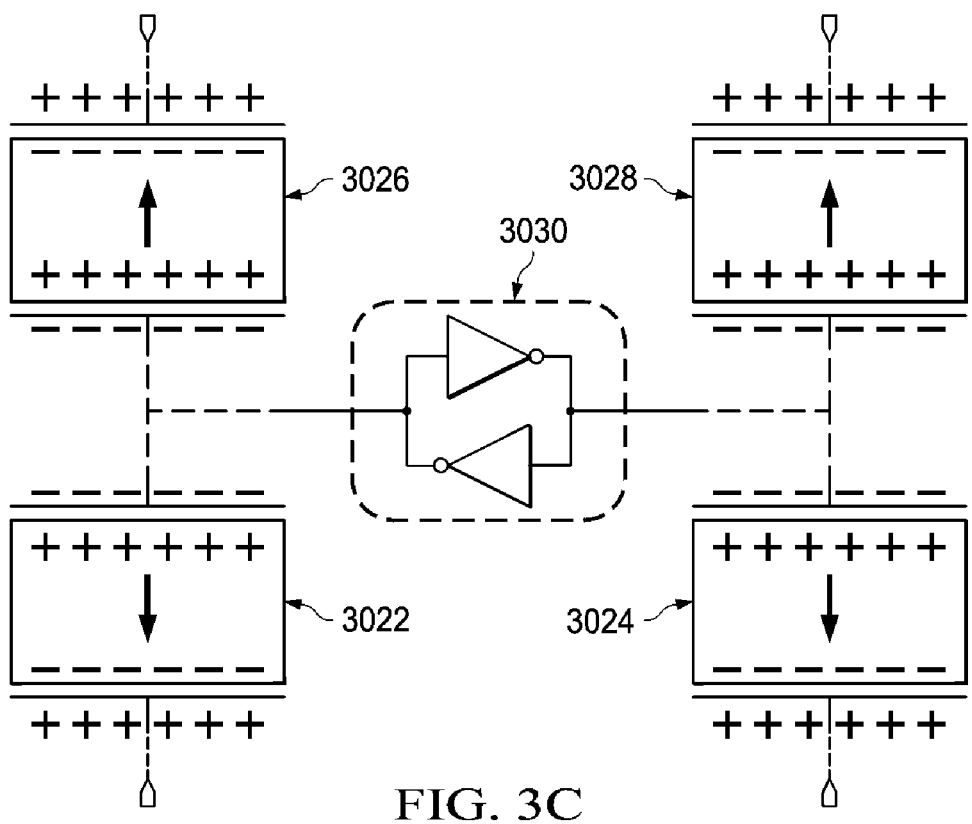

Referring to FIG. 3C, a first data ferroelectric capacitor (3022) is in the "down" polarization orientation, and a second data ferroelectric capacitor (3024) is also in the "down" polarization orientation. Thus, the second data ferroelectric capacitor (3024) is polarized in a same orientation as the first data ferroelectric capacitor (3022). A first auxiliary data ferroelectric capacitor (3026) is in the "up" polarization orientation, and a second auxiliary data ferroelectric capacitor (3028) is also in the "up" polarization orientation. Thus, the second auxiliary data ferroelectric capacitor (3028) is polarized in a same orientation as the first auxiliary data ferroelectric capacitor (3026). The data ferroelectric capacitors (3022, 3024, 3026, 3028) are coupled to a data storage circuit (3030) as described in reference to FIG. 2.

Figure 3D:
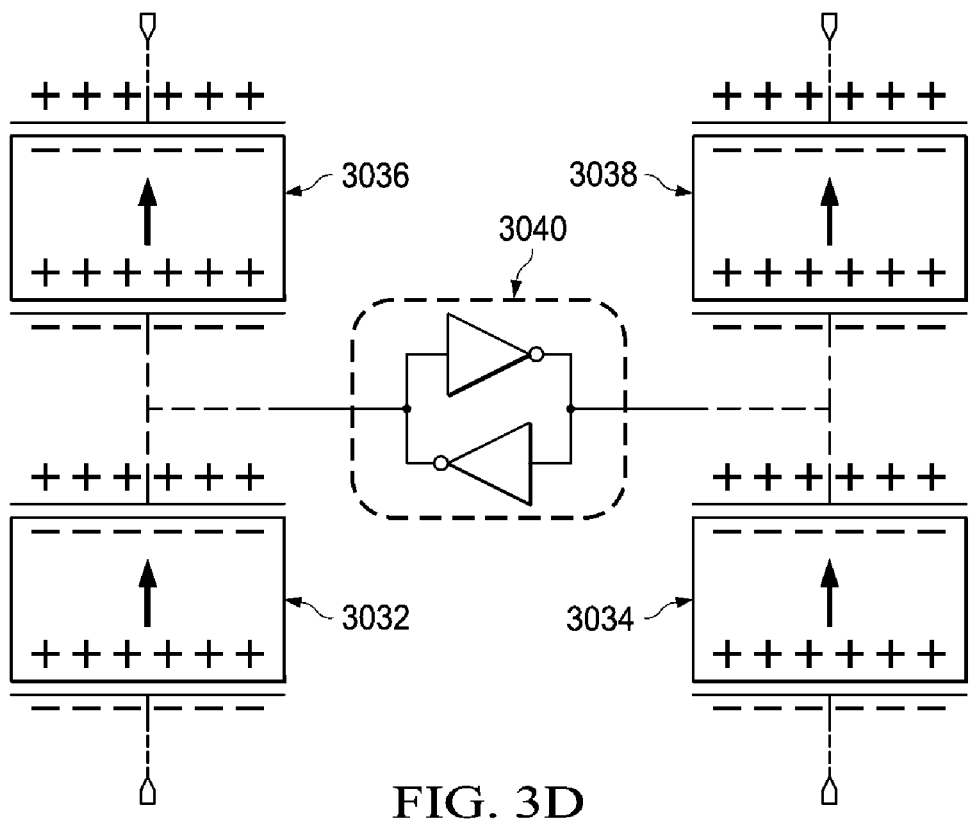

Referring to FIG. 3D, a first data ferroelectric capacitor (3032), a second data ferroelectric capacitor (3034), a first auxiliary data ferroelectric capacitor (3036), and a second auxiliary data ferroelectric capacitor (3038) are all in the "up" polarization orientation. Thus, the first auxiliary data ferroelectric capacitor (3036) is polarized in a same orientation as the first data ferroelectric capacitor (3032), and the second auxiliary data ferroelectric capacitor (3038) is polarized in a same orientation as the second data ferroelectric capacitor (3034). The data ferroelectric capacitors (3032, 3034, 3036, 3038) are coupled to a data storage circuit (3040) as described in reference to FIG. 2.

Figure 3E:
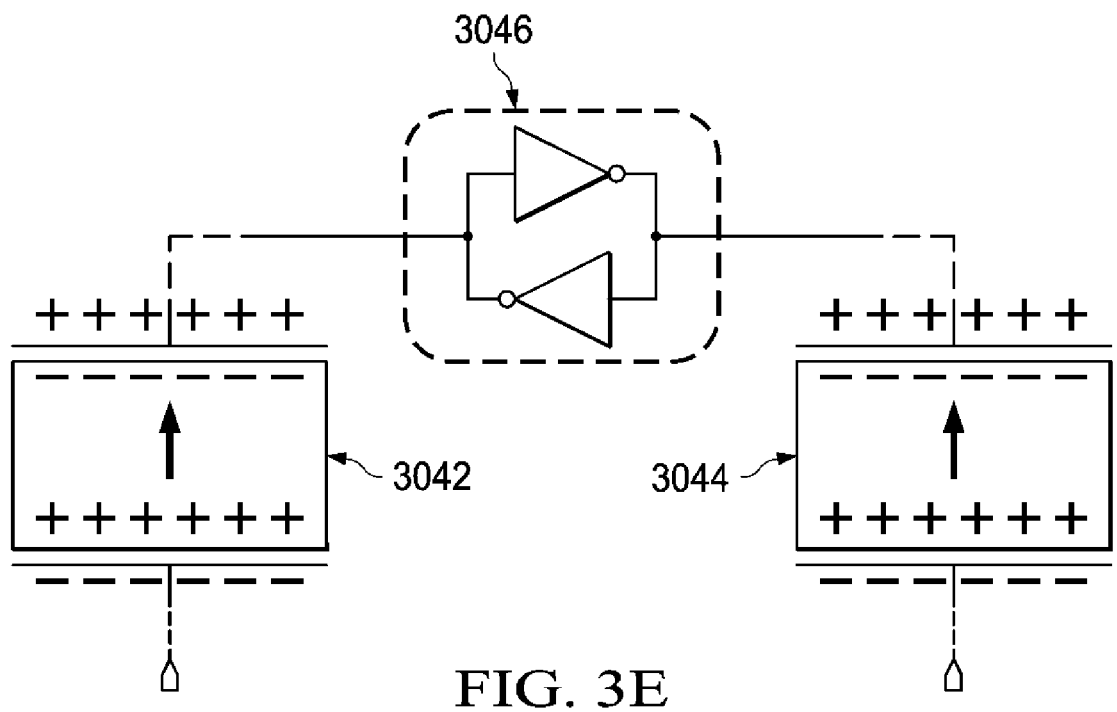
Figure 3F:
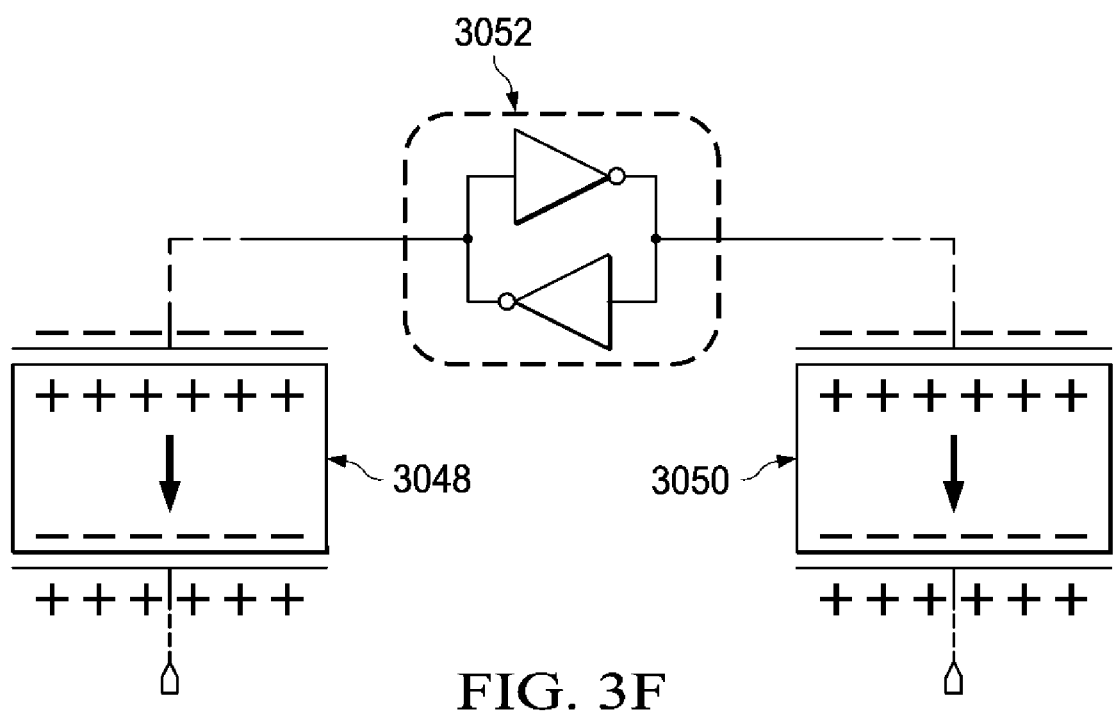

FIG. 3E and FIG. 3F depict polarization configurations for programmable data storage components containing a first data ferroelectric capacitor coupled to a first state node (such as first state node 2002 of FIG. 2) and a second data ferroelectric capacitor coupled to a complementary second state node (such as second state node 2004 of FIG. 2). Referring to FIG. 3E, a first data ferroelectric capacitor (3042) is in the "up" polarization orientation. A second data ferroelectric capacitor (3044) is also in the "up" polarization orientation. Thus, the second data ferroelectric capacitor (3044) is polarized in a same orientation as the first data ferroelectric capacitor (3042). The data ferroelectric capacitors (3042, 3044) are coupled to a data storage circuit (3046) as described in reference to FIG. 2.

Referring to FIG. 3F, a first data ferroelectric capacitor (3048) is in the "down" polarization orientation. A second data ferroelectric capacitor (3050) is also in the "down" polarization orientation. Thus, the second data ferroelectric capacitor (3050) is polarized in a same orientation as the first data ferroelectric capacitor (3048). The data ferroelectric capacitors (3048, 3050) are coupled to a data storage circuit (3052) as described in reference to FIG. 2.

Figure 3G:
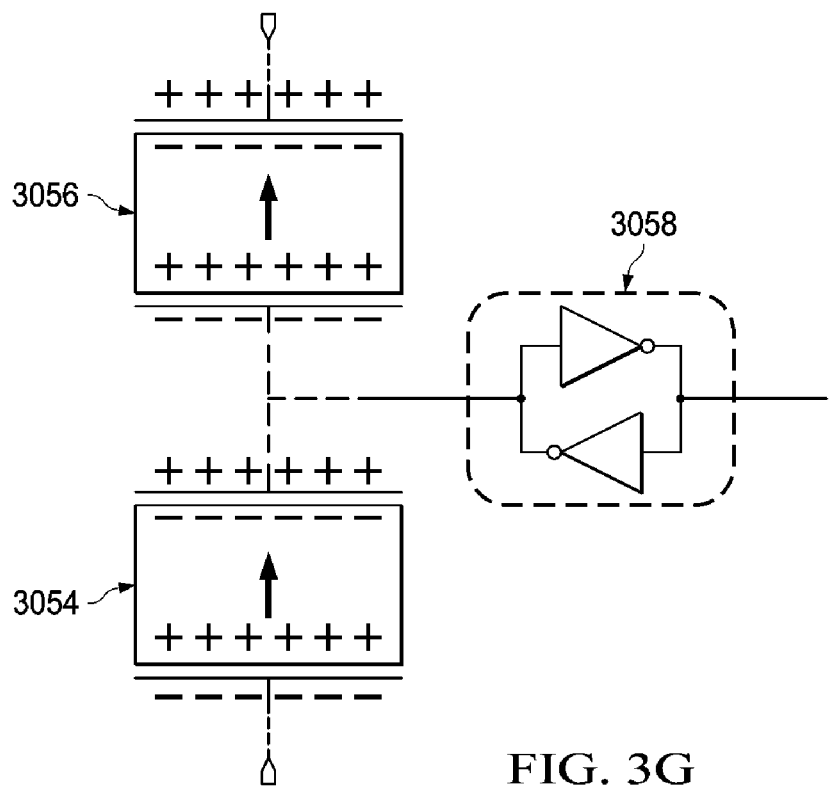
Figure 3H:
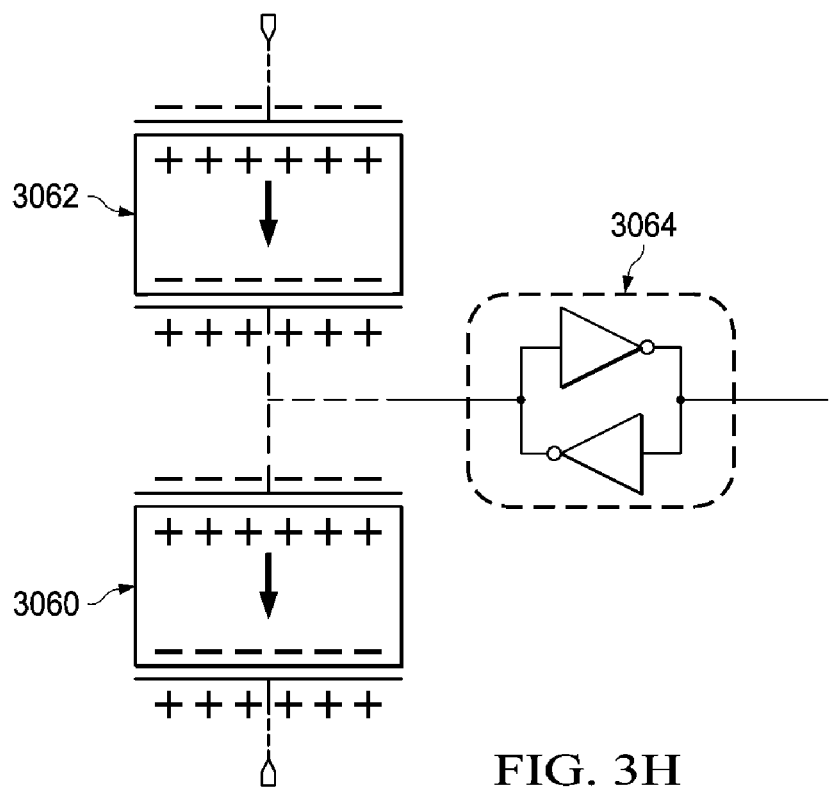

FIG. 3G and FIG. 3H depict polarization configurations for programmable data storage components containing a first data ferroelectric capacitor coupled to a first state node (such as first state node 2002 of FIG. 2) and a second data ferroelectric capacitor also coupled to the first state node. There are no data ferroelectric capacitors coupled to a second state node (such as second state node 2004 of FIG. 2) in this embodiment. Referring to FIG. 3G, a first data ferroelectric capacitor (3054) is in the "up" polarization orientation. A second data ferroelectric capacitor (3056) is also in the "up" polarization orientation. Thus, the second data ferroelectric capacitor (3056) is polarized in a same orientation as the first data ferroelectric capacitor (3054). The data ferroelectric capacitors (3054, 3056) are coupled to a data storage circuit (3058).

Referring to FIG. 3H, a first data ferroelectric capacitor (3060) is in the "down" polarization orientation. A second data ferroelectric capacitor (3062) is also in the "down" polarization orientation. Thus, the second data ferroelectric capacitor (3062) is polarized in a same orientation as the first data ferroelectric capacitor (3060). The data ferroelectric capacitors (3060, 3062) are coupled to a data storage circuit (3064).

Figure 4:
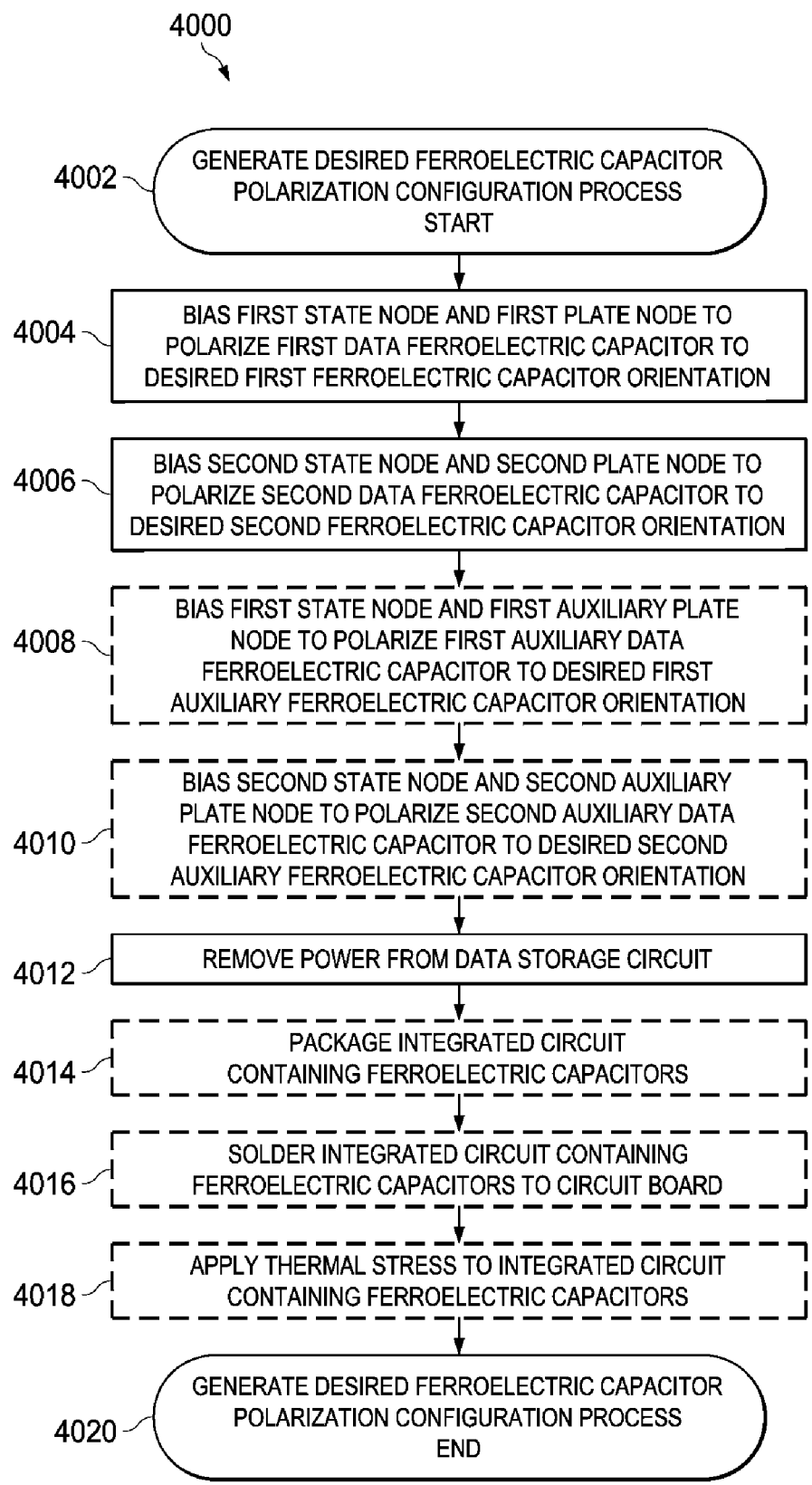
FIG. 4 is a flowchart of a process for generating a desired polarization configuration in a programmable data storage component according to an embodiment.

FIG. 4 is a flowchart of a process (4000) for generating a desired polarization configuration in a programmable data storage component according to an embodiment. The flowchart of FIG. 4 may apply to a programmable data storage component (2000) as depicted in FIG. 2. It will be recognized that steps in FIG. 4 which relate to ferroelectric capacitors not present in an instant realization of the programmable data storage component may be disregarded without compromising the scope of the instant embodiment. The process begins (4002) with step (4004), which is to bias the first state node (2002) and the first plate node (2052) so as to polarize the first data ferroelectric capacitor (2012) in a desired first ferroelectric capacitor orientation. Timing pulses may be applied to turn on passgate transistors, the isolation transistor (2014) or the CMOS switch (2016), if present, to bias the first state node (2002).

Step (4006) is to bias a second state node (2004) of the programmable data storage component (2000) and the second plate node (2054) so as to polarize the second data ferroelectric capacitor (2032) in a desired second data ferroelectric capacitor orientation. Timing pulses may be applied to turn on passgate transistors, the isolation transistor (2034) or the CMOS switch (2036), if present, to bias the second state node (2004).

If the first auxiliary ferroelectric capacitor (2020) is a data ferroelectric capacitor, step (4008) is executed, which is to bias the first state node (2002) of the programmable data storage component (2000) and the first auxiliary plate node (2056) so as to polarize the first auxiliary ferroelectric capacitor (2020) in a desired first auxiliary ferroelectric capacitor orientation. Timing pulses may be applied to turn on passgate transistors, the isolation transistor (2022) or the CMOS switch (2016), if present, to bias the first state node (2002). In one realization of the instant embodiment, the first plate node (2052) may be biased or floated so as to preserve the desired first ferroelectric capacitor orientation of the first data ferroelectric capacitor (2012).

If the second auxiliary ferroelectric capacitor (2040) is a data ferroelectric capacitor, step (4010) is executed, which is to bias the second state node (2004) of the programmable data storage component (2000) and the second auxiliary plate node (2058) so as to polarize the second auxiliary ferroelectric capacitor (2040) in a desired second auxiliary ferroelectric capacitor orientation. Timing pulses may be applied to turn on passgate transistors, the isolation transistor (2042) or the CMOS switch (2036), if present, to bias the second state node (2004). In one realization of the instant embodiment, the second plate node (2054) may be biased or floated so as to preserve the desired second ferroelectric capacitor orientation of the second data ferroelectric capacitor (2032). In an alternate realization of the instant embodiment, steps (4004), (4006), (4008) and (4010) may be executed in any order.

Subsequently, step (4012) is executed, which is to remove power to an integrated circuit containing the programmable data storage component (2000) so that the polarization orientations generated in steps (4004) through (4010) are preserved. In some realizations of the instant embodiment, no power may be applied to the data storage circuit (2006) during execution of steps (4004) through (4010).

Subsequently, optional step (4014) may be executed, which is to package the integrated circuit containing the programmable data storage component (2000) with the ferroelectric capacitors (2012, 2020, 2032, 2040). In one realization of step (4014), the integrated circuit may be encapsulated in a plastic material. In another realization, the integrated circuit may be attached to a chip carrier using a thermosetting adhesive.

Subsequently, optional step (4016) may be executed, which is to solder an integrated circuit containing the programmable data storage component (2000) with the ferroelectric capacitors (2012, 2020, 2032, 2040) to a circuit board. In one realization of step (4016), the integrated circuit may be heated above 100 C during the solder step.

Subsequently, optional step (4018) may be executed, which is to apply a thermal stress to the integrated circuit containing the programmable data storage component (2000) with the ferroelectric capacitors (2012, 2020, 2032, 2040). The thermal stress may be part of a test or burn-in operation. In one realization of step (4018), the thermal stress may include a cycle above 80 C for at least 1000 hours.

Subsequently, the process of generating a desired polarization configuration is ended (4020).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An process for polarizing a programmable data storage component of an integrated circuit, comprising:
   polarizing a first data ferroelectric capacitor of said programmable data storage component;
   polarizing a second data ferroelectric capacitor of said programmable data storage component so that said second data ferroelectric capacitor is polarized in a same orientation as said first data ferroelectric capacitor; and
   subsequently removing power to said programmable data storage component of said integrated circuit, so that polarization orientations generated in said steps of polarizing said first data ferroelectric capacitor and said second data ferroelectric capacitor are preserved.

2. The process of claim 1, in which said steps of polarizing said first data ferroelectric capacitor and said second data ferroelectric capacitor causes said first data ferroelectric capacitor to be in an "up" polarization orientation and said second data ferroelectric capacitor to be in an "up" polarization orientation.

3. The process of claim 1, in which said steps of polarizing said first data ferroelectric capacitor and said second data ferroelectric capacitor causes said first data ferroelectric capacitor to be in a "down" polarization orientation and said second data ferroelectric capacitor to be in a "down" polarization orientation.

4. The process of claim 1, further including encapsulating said integrated circuit in a plastic material, performed after said step of removing power to said integrated circuit.

5. The process of claim 1, further including soldering said integrated circuit to a circuit board, performed after said step of removing power to said integrated circuit.

6. An process for polarizing a programmable data storage component of an integrated circuit, comprising:
   polarizing a first data ferroelectric capacitor of said programmable data storage component;
   polarizing a first auxiliary data ferroelectric capacitor of said programmable data storage component so that said first auxiliary data ferroelectric capacitor is polarized in a same orientation as said first data ferroelectric capacitor; and
   subsequently removing power to said programmable data storage component of said integrated circuit, so that polarization orientations generated in said steps of polarizing said first data ferroelectric capacitor and said first auxiliary data ferroelectric capacitor are preserved.

7. The process of claim 6, in which said steps of polarizing said first data ferroelectric capacitor and said first auxiliary data ferroelectric capacitor causes said first data ferroelectric capacitor to be in an "up" polarization orientation and said first auxiliary data ferroelectric capacitor to be in an "up" polarization orientation.

8. The process of claim 6, in which said steps of polarizing said first data ferroelectric capacitor and said first auxiliary data ferroelectric capacitor causes said first data ferroelectric capacitor to be in a "down" polarization orientation and said first auxiliary data ferroelectric capacitor to be in a "down" polarization orientation.

9. The process of claim 6, further including encapsulating said integrated circuit in a plastic material, performed after said step of removing power to said integrated circuit.

10. The process of claim 6, further including soldering said integrated circuit to a circuit board, performed after said step of removing power to said integrated circuit.

11. A process for polarizing a programmable data storage component of an integrated circuit, comprising:
   polarizing a first data ferroelectric capacitor of said programmable data storage component;
   polarizing a second data ferroelectric capacitor of said programmable data storage component so that said second data ferroelectric capacitor is polarized in a same orientation as said first data ferroelectric capacitor;
   polarizing a first auxiliary data ferroelectric capacitor of said programmable data storage component;
   polarizing a second auxiliary data ferroelectric capacitor of said programmable data storage component so that said second auxiliary data ferroelectric capacitor is polarized in a same orientation as said first auxiliary data ferroelectric capacitor; and subsequently removing power to said programmable data storage component of said integrated circuit, so that polarization orientations generated in said steps of polarizing said first data ferroelectric capacitor, polarizing said second data ferroelectric capacitor, polarizing said first auxiliary data ferroelectric capacitor; and polarizing said second auxiliary data ferroelectric capacitor are preserved.

12. The process of claim 11, in which said steps of polarizing said first data ferroelectric capacitor and said second data ferroelectric capacitor cause said first data ferroelectric capacitor to be in an "up" polarization orientation and said second data ferroelectric capacitor to be in an "up" polarization orientation.

13. The process of claim 11, in which said steps of polarizing said first data ferroelectric capacitor and said second data ferroelectric capacitor cause said first data ferroelectric capacitor to be in a "down" polarization orientation and said second data ferroelectric capacitor to be in a "down" polarization orientation.

14. The process of claim 11, in which said steps of polarizing said first auxiliary data ferroelectric capacitor and said second auxiliary data ferroelectric capacitor cause said first auxiliary data ferroelectric capacitor to be in an "up" polarization orientation and said second auxiliary data ferroelectric capacitor to be in an "up" polarization orientation.

15. The process of claim 11, in which said steps of polarizing said first auxiliary data ferroelectric capacitor and said second auxiliary data ferroelectric capacitor cause said first auxiliary data ferroelectric capacitor to be in a "down" polarization orientation and said second auxiliary data ferroelectric capacitor to be in a "down" polarization orientation.

16. The process of claim 11, further including encapsulating said integrated circuit in a plastic material, performed after said step of removing power to said integrated circuit.

17. The process of claim 11, further including soldering said integrated circuit to a circuit board, performed after said step of removing power to said integrated circuit.

18. The process of claim 17, wherein a ferroelectric capacitor polarization circuit performs said steps of polarizing said first data ferroelectric capacitor, said second data ferroelectric capacitor, said first auxiliary data ferroelectric capacitor, and said second auxiliary data ferroelectric capacitor.

19. An integrated circuit, comprising:
a programmable data storage component, said programmable data storage component containing:
  a data storage circuit;
  a first state node coupled to said data storage circuit and a second state node coupled to said data storage circuit, said first state node and said second state node being complementary state nodes;
  a first data ferroelectric capacitor coupled to said first state node;
  a first plate node coupled to said first data ferroelectric capacitor;
  a second data ferroelectric capacitor coupled to said second state node; and
  a second plate node coupled to said second data ferroelectric capacitor; and
a ferroelectric capacitor polarization circuit coupled to said programmable data storage component and configured to polarize said first data ferroelectric capacitor and said second data ferroelectric capacitor in desired polarization configurations by applying biases to said first state node, said second state node, said first plate node and said second plate node.

20. The integrated circuit of claim 19, further including:
a first auxiliary data ferroelectric capacitor coupled to said first state node;
a first auxiliary plate node coupled to said first auxiliary data ferroelectric capacitor;
a second auxiliary data ferroelectric capacitor coupled to said second state node; and
a second auxiliary plate node coupled to said second auxiliary data ferroelectric capacitor;
in which said ferroelectric capacitor polarization circuit is further configured to polarize said first auxiliary data ferroelectric capacitor and said second auxiliary data ferroelectric capacitor in desired polarization configurations by applying biases to said first state node, said second state node, said first auxiliary plate node and said second auxiliary plate node.

* * * * *